United States Patent [19]
Rockett, Jr.

[11] Patent Number: 4,797,804
[45] Date of Patent: Jan. 10, 1989

[54] HIGH DENSITY, HIGH PERFORMANCE, SINGLE EVENT UPSET IMMUNE DATA STORAGE CELL

[75] Inventor: Leonard R. Rockett, Jr., Washington, D.C.

[73] Assignee: International Business Machines Corporation, Armonk, N.Y.

[21] Appl. No.: 23,426

[22] Filed: Mar. 9, 1987

[51] Int. Cl.[4] .......................... G11C 7/00; G11C 7/02
[52] U.S. Cl. .................................... 365/154; 365/156; 365/181; 365/205
[58] Field of Search ................. 365/154, 189, 228, 181

[56] References Cited

U.S. PATENT DOCUMENTS

| | | | |
|---|---|---|---|
| 3,786,282 | 1/1974 | Orndorff | 307/291 |
| 4,416,049 | 11/1983 | McElroy | 29/571 |
| 4,420,871 | 12/1983 | Scheibe | 29/571 |
| 4,425,574 | 1/1984 | Silvestri et al. | 357/50 |
| 4,432,006 | 2/1984 | Takei | 357/23 |
| 4,441,246 | 4/1984 | Redwine | 29/571 |
| 4,458,262 | 7/1984 | Chao | 357/23.11 |
| 4,467,519 | 8/1984 | Glang et al. | 29/576 |
| 4,481,524 | 11/1984 | Tsujide | 357/42 |
| 4,638,463 | 1/1987 | Rockett, Jr. | 365/205 |

OTHER PUBLICATIONS

E. L. Peterson, et al., "Calculation of Cosmic-Ray Induced Soft Upsets and Scaling in VLSI Devices," *IEEE Trans. Nucl. Sci.*, vol. NS-29, No. 6, Dec. 1982.
E. L. Peterson, et al., "Suggested Single Event Upset Figure of Merit," *IEEE Trans. Nucl. Sci.*, vol. NS-30, No. 6, Dec. 1983.
S. S. Malhi, et al., "Characteristics and Three-Dimensional Integration of MOSFETs in Small-Grain LPCVD Polycrystalline Silicon," *IEEE JSSC*, vol. SC-20, No. 1, Feb. 1985.

Primary Examiner—Stuart N. Hecker
Assistant Examiner—Alyssa H. Bowler
Attorney, Agent, or Firm—John E. Hoel

[57] ABSTRACT

The data cell invention disclosed herein is a CMOS latch having a first CMOS inverter and a second CMOS inverter which have their respective storage nodes interconnected by cross-coupling connections which each include a gated polysilicon resistor. The respective storage nodes of the cell are connected through word line transfer gates to bit lines which serve to both write in and read out the state of the cell. The control gate of the word line transistors is also connected to the control gates of the respective gated polysilicon resistors in the cross-coupled connections for the cell. In normal operation, when the word line transfer gates are not conductive, the gated polysilicon resistors are also not conductive. When it is desired to write information into the cell during normal conditions, when the word line transfer gates are made conductive, the gated polysilicon resistors are also made conductive, thereby offering a minimum resistance to charge which is to be transferred between the respective storage nodes of the cell. However, during a single event upset condition, when one or more of the sensitive regions of the cell undergo an abrupt charge transfer due to the presence of cosmic rays or other ionizing radiation phenomena, since the gated polysilicon resistors are in their high resistance state, they impede the flow of any charges between the respective storage nodes of the cell. In this manner, after the single event upset has dissipated, the cell will have retained its original stored binary state. Thus, an enhanced resistance to single event upset conditions is provided by the invention while not imposing significant reductions in the speed of operation during normal conditions.

4 Claims, 3 Drawing Sheets

NORMAL CONDITION—STEADY STATE

Tfb > Trec → NO BIT-FLIP ERROR

HIGH DENSITY, HIGH PERFORMANCE, SINGLE EVENT UPSET IMMUNE DATA STORAGE CELL

BACKGROUND OF THE INVENTION

1. Technical Field

The invention disclosed broadly relates to semiconductor devices and circuits and more particularly relates to an improved integrated circuit which is immune to single event upsets.

2. Background Art

As the number of devices in a very large scale integrated (VLSI) circuit chip surpasses $10^5$, the individual transistor devices which form its component elementary logic circuits, occupy areas of the chip on the order of a few square microns. The quantity of charge which is transferred between field effect transistor devices of this size while carrying out normal switching operations, in on the order of 0.1 picoCoulombs ($10^{-12}$ Colombs), making them very susceptible to electrostatic perturbations.

One ubiquitous source of such perturbations is cosmic rays, a highly penetrating radiation apparently reaching the earth in all directions from outer space. The primary cosmic rays entering the earth's atmosphere are almost entirely composed of positively charged atomic nuclei which collide with air nuclei high in the atmosphere, forming showers of positively and negatively charged nuclear fragments called secondary cosmic rays. These secondary cosmic rays penetrate all matter at the earth's surface and as they pass through a material object, they undergo collisions with electrons and nuclei of which the material is composed, leaving a track of electrostatic charge along the way. The linear charge density along such a track can be typically 0.3 picoCoulombs per micron, which is on the same scale as the quantity of charge involved in the switching operation of a single field effect transistor on a VLSI chip.

This becomes a significant problem in latch circuits composed of such devices, since a latch must sense and reliably store a binary bit of information for intervals measurable in millions of machine cycles. In order to better understand this problem, reference will be made to a typical integrated circuit field effect transistor latch and the mechanism of its response to an electrostatic perturbation such as a cosmic ray, will be discussed.

To begin this description, several terms need to be defined and suitable abbreviations established. The N channel field effect transistor circuit technology will be the example used herein. The abbreviation NFET will be used herein to refer to an N channel field effect transistor device. Such devices are generally fabricated by forming an N-type conductivity source diffusion and N-type drain diffusion in the surface of a P-type conductivity silicon substrate. The channel region of the substrate separating the source and drain regions, is covered by a gate insulator layer and a gate electrode. An enhancement mode NFET is normally nonconducting between its source and drain and it can be switched into conduction by applying a positive potential to its gate electrode, with respect to the potential of its source. A depletion mode NFET is normally conducting between its source and drain and it can be switched into nonconduction by applying a negative potential to its gate electrode, with respect to the potential of its source.

The abbreviation PFET will be used herein to refer to a P channel field effect transistor device. Such devices are generally fabricated by forming P-type conductivity source diffusion and P-type conductivity drain diffusions within an N-type conductivity diffusion called an N-well which, in turn, has been formed in the P-type semiconductor substrate for the integrated circuit. The channel region of the N-well separating the P-type source and drain diffusions is covered by the gate insulator layer and the gate electrode. An enhancement mode PFET is normally nonconducting between a source and drain when the gate-to-source potential is relatively negative, the opposite condition from that obtaining from an NFET device relative biasing.

One prior art approach to solving the single event upset problem for N channel enhancement mode/depletion mode flip-flop storage cells is described in U.S. Pat. No. 4,638,463 to L. R. Rockett, entitled "Fast Writing Circuit for a Soft Error Protected Storage Cell," issued Jan. 20, 1987 and assigned to the IBM Corporation. The principle of operation of the circuits disclosed in this earlier patent work well for enhancement mode/depletion mode circuit technology, however the problem of reducing the effect of single event upsets on complementary MOS (CMOS) circuits still remains significant. As used herein, CMOS refers to integrated circuits which employ both PFET and NFET devices connected so as to provide high speed, low power dissipation, integrated circuits for logic and memory applications.

Another prior art approach to reducing the effect of a single event upset in disturbing the stored state in an NFET flip-flop storage cell, is to provide a resistive element in the cross-coupling connection between the respective storage nodes of the cell. The purpose of the resistive element is to prevent the flow of charge from one node to the other node during the single event upset condition, thereby reducing the chances that the state of the cell will be disturbed. However, a significant disadvantage of such a prior art configuration is the reduction in the speed of operation of the flip-flop storage cell during normal write mode operations. The presence of the resistive device will increase the amount of time necessary to change the state of the flip-flop cell from a first binary state to a second binary state by flowing current from one node to the other node. It is this problem which is addressed by the invention disclosed and claimed herein.

OBJECT OF THE INVENTION

It is therefore an object of the invention to provide an improved technique for minimizing the effects of single event upsets in integrated circuits.

It is another object of the invention to provide an improved technique for minimizing the effects of single event upsets in CMOS integrated circuits.

It is still a further object of the invention to provide an improved technique for minimizing the effects of single event upsets in CMOS circuits, which does not adversely impact the speed of operation of the circuit during normal conditions.

SUMMARY OF THE INVENTION

These and other objects, features and advantages of the invention are accomplished by the high density, high performance single event upset immune data storage cell disclosed herein. The data cell invention disclosed herein is a CMOS latch having a first CMOS inverter and a second CMOS inverter which have their respective storage nodes interconnected by cross-coupling connections which each include a gated polysilicon resistor. The respective storage nodes of the cell are connected through word line transfer gates to bit lines which serve to both write in and read out the state of the cell. The control gate of the word line transistors is also connected to the control gates of the respective gated polysilicon resistors in the cross-coupled connections for the cell. In normal operation, when the word line transfer gates are not conductive, the gated polysilicon resistors are also not conductive. When it is desired to write information into the cell during normal conditions, when the word line transfer gates are made conductive, the gated polysilicon resistors are also made conductive, thereby offering a minimum resistance to charge which is to be transferred between the respective storage nodes of the cell. However, during a single event upset condition, when one or more of the sensitive regions of the cell undergo an abrupt charge transfer due to the presence of cosmic rays or other ionizing radiation phenomena, since the gated polysilicon resistors are in their high resistance state, they impede the flow of any charges between the respective storage nodes of the cell. In this manner, after the single event disturbance has dissipated, the cell will have retained its original stored binary state. Thus, an enhanced resistance to single event upset conditions is provided by the invention while not imposing significant reductions in the speed of operation during normal conditions.

BRIEF DESCRIPTION OF THE DRAWINGS

These and other objects, features and advantages of the invention will be more fully appreciated with reference to the accompanying figures.

DESCRIPTION OF THE BEST MODE FOR CARRYING OUT THE INVENTION

Figure 1:
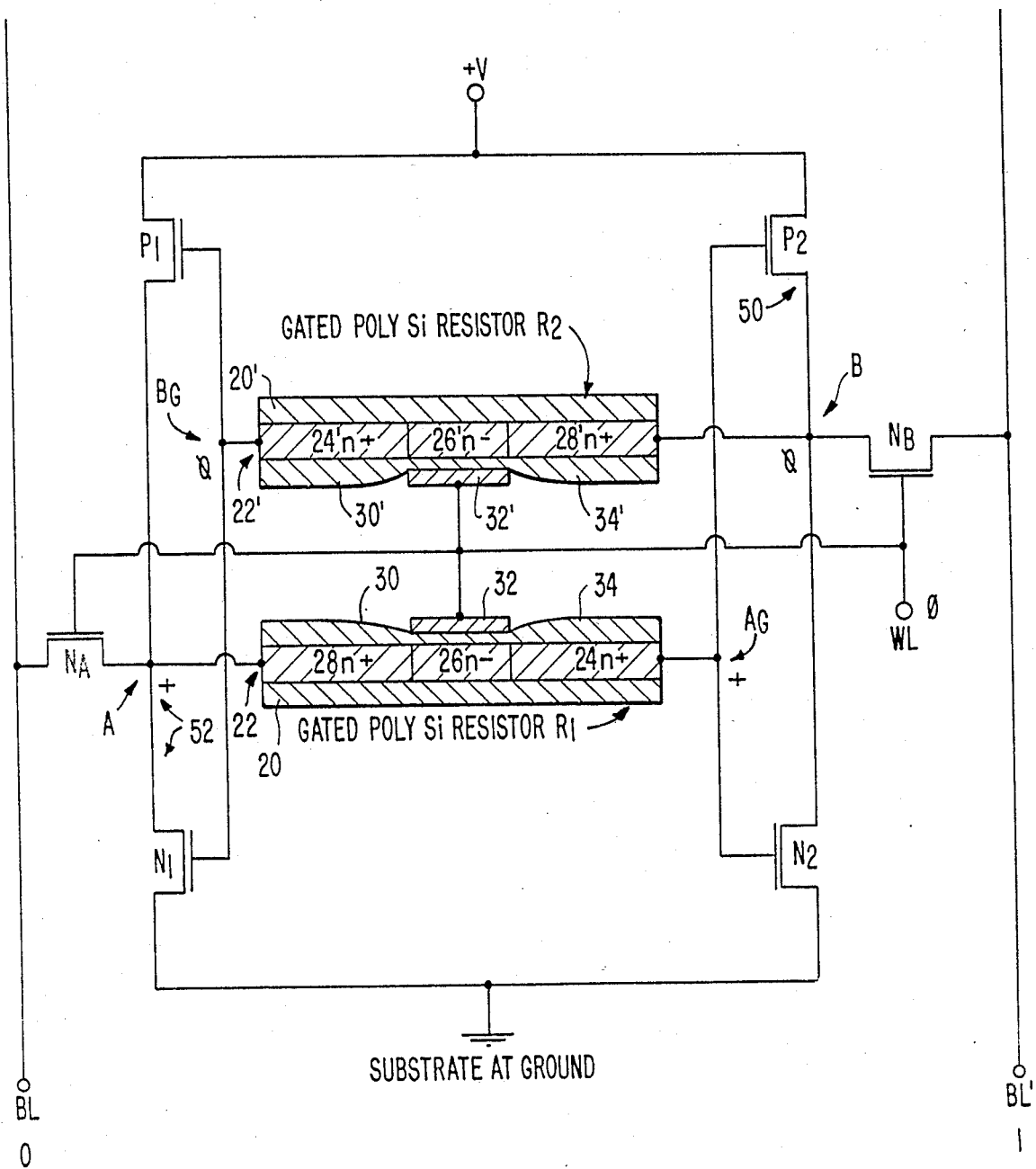
FIG. 1 is a schematic diagram of the invention in its steady state during normal conditions.

Turning now to FIG. 1, the invention is shown in its steady state for normal conditions. The circuit is a CMOS flip-flop storage cell comprising a first inverter portion having the P channel FET device P1 and the N channel FET device N1 mutually connected to a first storage node A. Storage node A is connected through a word line N channel FET transfer device NA to the bit line BL. Similarly, a second CMOS inverter is shown in FIG. 1 with the P channel FET device P2 and the N channel FET device N2 connected to the second storage node B. The second storage node B is connected through a second N channel FET transfer device NB to the second bit line BL'. The gates of the P channel device P1 and N channel device N1 are connected in common and are referred to as the node BG. The gates of the P channel FET device P2 and the N channel FET device N2 are connected in common and are referred to as the node AG. The first inverter is connected between the $+V$ potential and ground and the second inverter is also connected between the $+V$ potential and ground, as shown in FIG. 1.

The storage node A for the first inverter has a cross-coupling connection through the gated polysilicon resistor R1 to the node AG connected to the gates of the devices P2 and N2. The storage node B for the second inverter is connected through a second gated polysilicon resistor R2 to the node BG of the gates for the devices P1 and N1. The control gates 32 and 32' of the gated polysilion resistors R1 and R2, respectively, are connected in common to the word line control terminal WL which is connected to the gates of the word line transfer FET devices NA and NB.

The purpose of the gated polysilicon resistors R1 and R2 is to serve as conductive paths for the transfer of charge during normal conditions when writing into the storage cell, and yet to serve as highly resistive impedances to the flow of current between the respective sides of the storage cell during single event upset conditions.

The first gated polysilicon resistor R1 is formed on the surface of the insulating layer 20 of the integrated circuit, and consists of a layer of polycrystalline silicon 22 laid down on top of the insulating layer 20. During processing operations, the polysilicon layer 22 is doped to a high concentration of N-type conductivity dopant such as phosphorus, in the outer regions 24 and 28 and is doped to a lower conductivity by means of a lesser concentration of N-type dopant in the central, channel region 26. An example of the dimensions and dopant concentrations for the polysilicon layer 22 is as follows: thickness 0.25 microns, concentration of the regions 24 and 28 $10^{18}$ per $cm^3$, and concentration in the region 26 is $10^{15}$ per $cm^3$. Overlying the polysilicon layer 22 is a layer of insulating layer such as silicon dioxide 34 which has a thin gate oxide region 30 juxtaposed with the channel region 26 and having a thickness of approximately 150 Angstroms. Positioned on the thin oxide layer 30 is a conductor electrode 32 which can be composed of a metal or which can be a second polycrystalline silicon layer. In operation, when the potential of the node A and the potential of the node AG are each equal to or more positive than the potential of the electrode 32, the effective resistance of the gated polysilicon resistor R1 between the nodes A and AG is, for example, approximately 200K Ohms. Alternately, when the potential of the node A or the node AG is less positive than the potential of the gate electrode 32, conduction electrons which are present in the N+ type region 24 or the N+ type region 28 of the polysilicon layer 22 are attracted into the N− conductivity channel region 26 of the polysilicon layer 22. The presence of these additional conduction electrons in the region 26 reduces the effective overall resistance of the gated polysilicon resistor R1 between the node A and the node AG. For example, when the potential of the electrode 32 is approximately one volt more positive than the potential of the node A or the node AG, the effective resistance of the gated polysilicon resistor R1 is approximately 2000 Ohms, a reduction of two orders in magnitude in the resistance for R1.

The gated polysilicon resistor R2 connected between the node B and the node BG, has a structure which is similar to that described for the gated polysilicon resistor R1, with its designated portions 20', 22', 24', 26', 28', 30', 32' and 34' having the same structure and operation as that previously described for the unprimed reference numerals associated with the first gated polysilicon resistor R1. The operation of the gated polysilicon resistor R2 is the same as that which has been described for the operation of R1.

Figure 3:
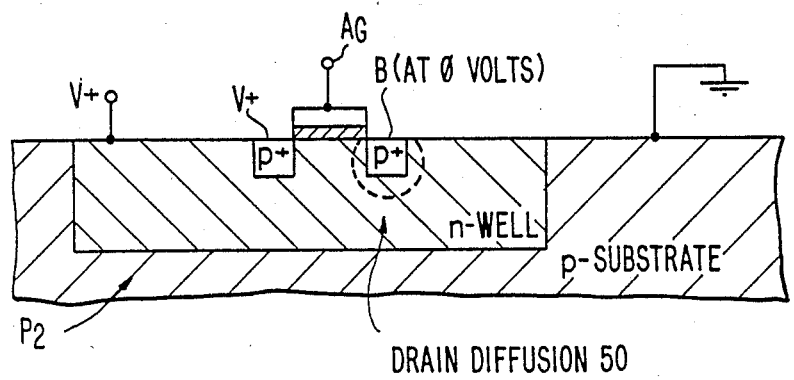
FIG. 3 is a cross-sectional diagram of the structure of the P channel FET device P2, illustrating its strongly reverse-biased drain diffusion 50, during the steady state condition shown in FIG. 1.

In the circuit environment shown in FIG. 1, the first binary state is associated with a relatively positive potential at node A and zero potential at node B. During this steady state, no enabling signal is applied to the word line WL and therefore the zero potential applied to the transfer gates NA and NB renders those devices in a nonconductive state and the zero potential applied to the gates 32 and 32' renders the gated polysilicon resistors R1 and R2, respectively, in a high resistance state. It is instructive to understand that there are sensitive regions associated with reverse-biased diffusions in the circuit, which are readily discharged during a single event upset condition. FIG. 3 illustrates the P channel FET device P2 which is positioned in its N-well which is positively biased to $+V$ potential. In the storage state shown in FIG. 1, the drain diffusion 50 of the P channel FET device P2 is strongly reverse-biased because the node B is at zero volts causing the diffusion 50 to be at zero volts whereas the N-well surrounding the diffusion 50 is at $+V$ volts potential. When a cosmic ray or other ionizing radiation causes the production of hole-electron pairs in the vicinity of the drain diffusion 50, the electrons are attracted to the positively biased N-well whereas the holes are attracted to the relatively negatively biased drain diffusion 50. If the connection between the node B and the node BG and the connection between the node A and the node AG had a low or negligible resistance, this charge transfer at drain diffusion 50 would then be applied to the gates of the devices P1 and N1, thereby potentially transferring the disturbed condition at node B over to the node A, and from the node A to the node AG and then to the gates of devices P2 and N2, reinforcing the disturbed condition at node B, resulting in a bit-flip error. However, referring to FIG. 1, with the presence of the gated polysilicon resistor R2 in the cross-coupling connection between the node B and the node BG, the high resistance of approximately 200K Ohms impedes the transfer of charges between the nodes B and BG. With the presence of the gated polysilicon resistor R1 in the cross-coupling connection between the node A and the node AG, the high resistance of approximately 200K Ohms inhibits any feedback response between the nodes A and AG. Typically, in a single event upset condition, the drain diffusion 50 will encounter up to a 7 picoCoulombs charge transfer having approximately a 0.1 nanosecond duration. The presence of the gated polysilicon resistor R2 in its high resistance state, will prevent the transfer of that charge disturbance from the node B over to the gates of the devices P1 and N1. The presence of the gated polysilicon resistor R1 in its high resistance state, will prevent the feedback of the disturbance from node A to the gates of devices P2 and N2. The combined effect that gated polysilicon resistors R2 and R1 have on the response of the flip-flop storage cell during a single event upset condition prevents the occurrence of bit-flip errors.

Figure 4:
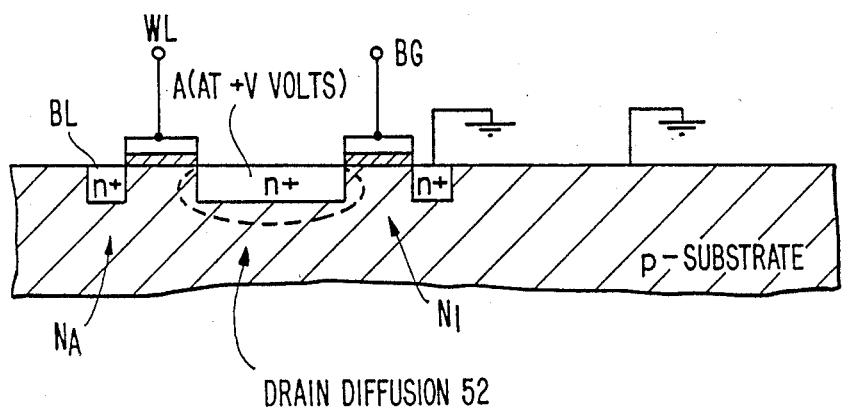
FIG. 4 is a cross-sectional view of the FET devices NA and N1 which are N channel FET devices, the figure showing the strongly reverse-biased drain diffusion 52 for the steady state, normal condition of the circuit shown in FIG. 1.

Another sensitive region in the circuit of FIG. 1 is the N-type drain diffusion for the N channel transfer device NA and the N channel device N1. Typically, these devices will be built as is shown in FIG. 4. The devices will share a common drain diffusion 52 which is biased at $+V$ volts in the binary storage state shown in FIG. 1. At the same time, the P-type substrate within which the drain diffusion 52 is formed, is biased at ground potential. This creates a strongly reverse-biased drain diffusion 52. If a single event upset condition occurs in the vicinity of the drain diffusion 52, the hole-electron pairs produced by that event will upset the steady state condition of the drain diffusion 52. Holes which are produced by the single event upset condition will be attracted to the relatively negatively biased P-type substrate whereas the electrons produced by the event will be attracted to the relatively positively biased N-type drain diffusion 52. The resultant charge pulse changes the stored charge state at the node A and, if there were a low resistance connection between the node A and the node AG, and a low resistance connection between the node B and the node BG, that charge could also affect the conduction states of the devices P2 and N2 and the feedback response could affect the conduction states of the devices P1 and N1. However, by virtue of the presence of the gated polysilicon resistor R1 in the cross-coupled connection between the node A and the node AG of FIG. 1, the high impedance state of approximately 200K Ohms for the resistor R1 will impede the transfer of charge between the node A and the node AG. Furthermore, by virtue of the presence of the gated polysilicon resistor R2 in the cross-coupled connection between the node B and the node BG of FIG. 1, the high impedance state of approximately 200K Ohms for resistor R2 will inhibit the feedback response between the node B and the node BG. In a manner similar to that described for the operation of the combination of gated polysilicon resistor R2 and gated polysilicon resistor R1 in preventing bit-flip errors from occurring when a single event upset condition occurs at drain diffusion 50, the combination of gated polysilicon resistor R1 and gated polysilicon resistor R2, will prevent the bit-flip error condition from occurring when a single event upset condition occurs at drain diffusion 52.

Figure 2:
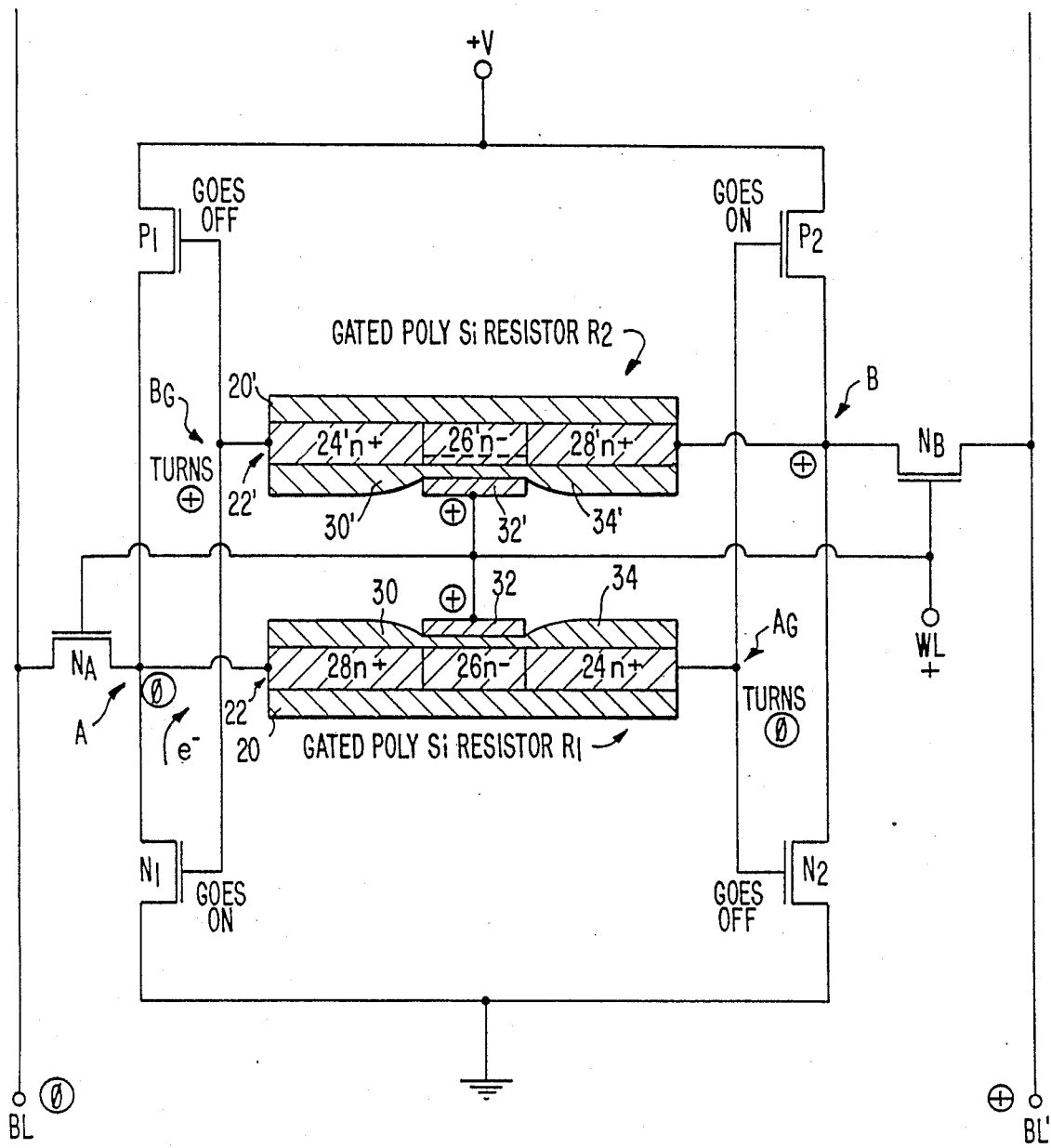
FIG. 2 is a schematic circuit diagram of the invention during a write operation, during normal conditions.

Although the circuit of FIG. 1 is protected from the effects of a single event upset, the circuit still provides high speed operation for normal writing of the cell. Reference is made to FIG. 2 which shows the inventive circuit of FIG. 1 when it is desired to write the opposite storage state into the cell, from that which was shown for FIG. 1. To change the existing storage state shown in FIG. 1 into the opposite storage state shown in FIG. 2, the bit line BL is set to zero volts and the bit line BL' is set to the $+V$ volts. Then, the word line terminal is biased to $+V$ volts, making the transfer devices NA and NB conductive, thereby applying the zero volt potential to the node A and the $+V$ volt potential to the node B. The word line potential of $+V$ is also applied to the gate electrodes 32 and 32' of the gated polysilicon resistors R1 and R2, respectively. The gated polysilicon resistor R2 turns on before the gated polysilicon resistor R1, because the polysilicon layer 22' of the resistor R2 was at zero volts in the beginning. Thus, the conduction of electrons which reside in the regions 24' and 28' of the resistor R2 are attracted to the relatively positive potential of the gate conductor 32', thereby making the channel region 26' conductive lowering the overall resistance of the gated polysilicon resistor R2 to approximately 2000 Ohms. This enables the transfer of the relatively positive potential being applied at node B through the transfer device NB, to the node BG and then to the gates of the devices P1 and N1. This causes the P channel device P1 to turn off and the N channel device N1 to turn on. As a result, the zero volt potential applied at the ground connection is transferred through the device N1 to the node A, reinforcing the state which was applied by the bit line BL. This relatively low potential is now present at the region 28 of the gated polysilicon resistor R1. Thus, conduction electrons present in the region 28 of the resistor R1 are attracted into the channel region 26 which is in the vicinity of the relatively positively biased gate electrode 32. This causes the gated polysilicon resistor R1 to transition into its reduced resistance state of approximately 2000 Ohms, thereby allowing the transfer of electrons from the node A through the resistor R1 to the node AG. Thus, the zero volt potential applied at the node A is transferred to the gates of the devices P2 and N2. This causes the P channel device P2 to turn on and the N channel device N2 to turn off. As a result, the +V potential is applied through the device P2 to the storage node B, thereby reinforcing the positive potential which was applied through the transfer device NB from the bit line BL'. Now that the new, opposite storage state is latched in the storage cell of FIG. 2, the word line WL can return to its ground potential, thereby turning off the transfer devices NA and NB. The bit lines BL and BL' can also now resume their normal quiescent state. Since the potential of the word line WL resumes its zero volt potential, the gate electrodes 32 and 32' also resume their zero volt potential, thereby returning the gated polysilicon resistors R1 and R2, respectively, to their high resistance states of approximately 200K Ohms, respectively. The small amount of charge which will dissipate from nodes AG and BG during normal conditions can be replaced through small amounts of current which will flow through the gated polysilicon resistors R1 and R2, in their high resistance states.

In this manner, the resistance to single event upsets of the CMOS storage cell of FIG. 1 is enhanced while not adversely affecting the speed of operation of the storage cell during normal conditions.

Figure 5:
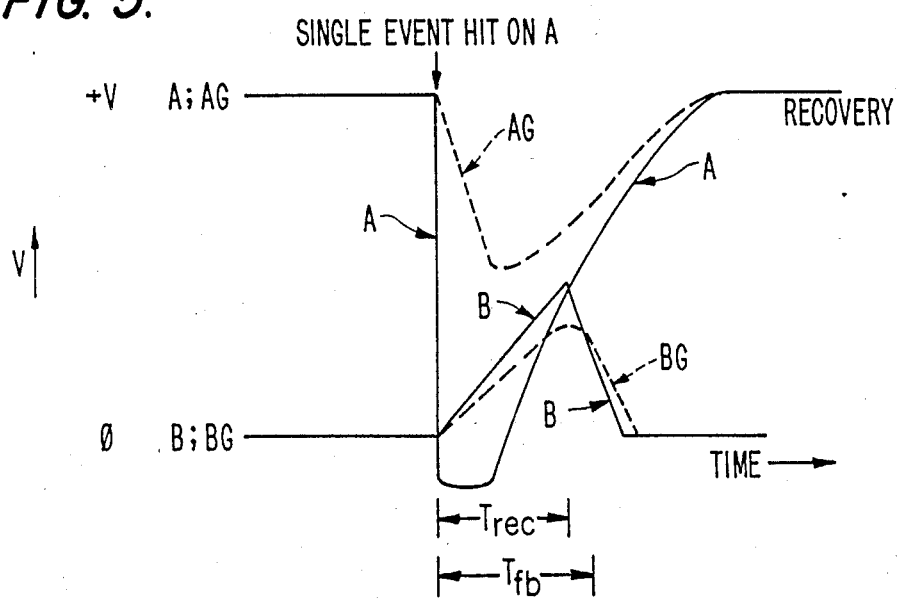
FIG. 5 illustrates voltage waveforms associated with the respective storage nodes of the invention, illustrating their behavior during a single event upset condition.

FIG. 5 is a plot of the voltage transitions which occur during single event upset conditions. The voltage curves in FIG. 5 correspond to the storage cell in FIG. 1 when it is in a quiescent state, storing binary information such that the nodes A and AG are at +V potential and nodes B and BG are at zero potential. If a single event upset condition occurs at node A, the voltage of node A undergoes an abrupt negative transition, momentarily saturating at a level near zero potential. The response of node AG to the single event disturbance at node A is tempered by the high resistance of gated polysilicon resistor R1, and consequently, node AG responds slowly. The response of node B to the single event disturbance at node A follows closely the tempered response of node AG as it slowly and weakly turns on device P2 while not fully turning off device N2. The response of node BG to the single event disturbance at node A is a further weakened and delayed replica of the transition experienced at node B, owing to the high resistance of gated polysilicon resistor R2. Consequently, the ability of node BG to respond quickly to a single event disturbance at node A does not exist due to the delays introduced into the response of the storage cell by the combined effect of gated polysilicon resistors R1 and R2. Bit-flip errors are avoided since a fast, reinforcing feedback at node BG is necessary to cause a single event upset when a single event upset condition occurs at node A. Therefore, once the charge transfer processes at node A have subsided, node A is charged high by device P1 whose originally on state has been essentially unaffected by the single event disturbance at node A, so the storage cell recovers to its initial binary state without upset. So as to ensure that the storage cell is never susceptible to bit-flip errors, the time constant describing the feedback response of the storage cell, $T_{fb}$, is designed to be larger than the time constant describing the recovery of the disturbed node to its initial voltage level, $T_{rec}$. $T_{fb}$ strongly depends on the designed value of high resistance for gated polysilicon resistors R1 and R2, while $T_{rec}$ is independent of the characteristics of gated polysilicon resistors R1 and R2. Therefore, the immunity of the storage cell to bit-flip errors is a controllable function of the storage cell design.

The substitution of a conventional field effect transistors for one of the gated polysilicon resistors in the circuit of FIG. 1 would not accomplish the objectives of the invention. For example, if one were to insert an N channel FET device in the circuit of FIG. 1 so as to substitute for the gated polysilicon resistor R1, by connecting the source drain path of the substituted FET device between the nodes A and AG and by connecting the gate of the substituted FET device to the word line WL, the FET device would be in a high resistance state when WL is at zero potential and would be in a low resistance state when WL is at a positive potential, thereby accomplishing the transfer of charge during the normal conditions when one wishes to write the opposite storage state into the circuit. However, during single event upset conditions, the substituted FET device will fail badly in providing any enhancement to the resistance of the overall circuit to single event upsets. This is because of the presence of the PN junction formed by the N-type diffusion of the source or drain of the substituted FET device in the P-type substrate. In the binary storage state shown in FIG. 1, the N-type diffusions of the substituted FET device which are connected to nodes A and AG will be biased at a relatively positive potential whereas as previously described, the P-type substrate is connected to the relatively negative ground potential. Thus, the N-type diffusions connected to nodes A and AG will be strongly reverse-biased. If a single event upset condition occurs in the vicinity of the node AG, this N-type diffusion of the substituted FET device undergoes a negative voltage transition, shutting off device N2 while turning device P2 on. Consequently, node B charges high. Since the affected node, node AG, is resistively isolated by the high off-device channel resistance of the substituted FET on one side and the very high input gate resistance of devices P2 and N2, there exists no responsive path for the recovery of the node AG to its initial state. Therefore, node AG remains in its disturbed, low state for an indefinite time period and consequently node B remains high for an indefinite time period. Realistically, a storage cell designed with conventional FET devices substituted for the gated polysilicon resistors R1 and R2 of FIG. 1 could remain in an erroneous, quasi-stable state in which both storage nodes, nodes A and B, are at the same potential for an indefinite time period, resulting in a bit-flip error. This will cause the circuit to propagate a bit-flip error, and therefore the circuit will have failed in its objective to be resistant to single event upset conditions. It is only the superior design of the invention disclosed herein with the use of the gate polysilicon resistors R1 and R2, which will provide for the enhanced resistance to single event upset conditions.

Although a specific embodiment of the invention has been disclosed, it will be understood by those having skill in the art that minor changes can be made to the specific embodiment without departing from the spirit and the scope of the invention.

What is claimed is:

1. A CMOS flip-flop storage cell having an enhanced immunity to single event upset conditions, comprising:

a first CMOS inverter circuit including a P channel FET device connected between a first storage node and a relatively positive potential and a first N channel FET device connected between said first storage node and a relatively negative potential, with the gates of said first P channel and first N channel devices connected in common to a first gate node and with said first storage node selectively connected to a first binary signal source by a write enable signal;

a second CMOS inverter circuit including a second P channel device whose source drain path is connected between a second storage node and said positive potential and a second N channel FET device having its source drain path connected between said second storage node and said relatively negative potential with said gates of said second P channel and said second N channel devices connected to a second gate node and said second storage node being selectively connected to a second binary signal source of opposite polarity to said first binary signal source by means of said write enable signal;

a first gated polysilicon resistor having its primary conduction path connected between said first storage node and said second gate node and its control electrode connected to said write enable signal;

a second gated polysilicon resistor having its primary conduction path connected between said second storage node and said first gate node and having its control electrode connected to said write enable signal;

said first gated polysilicon resistor and said second gated polysilicon resistor having a relatively high resistance state when said write enable signal is off, thereby providing a high impedance between said first storage node and said second gate node and a high impedance between said second storage node and said first gate node which minimizes the transfer of charge between said first inverter and said second inverter during single event upset conditions;

said first gated polysilicon resistor and said second gated polysilicon resistor assuming a low resistance state when said write enable signal is on, thereby enabling charge transfer between said first storage node and said second gate node and charge transfer between said second storage node and said first gate node for write operations during normal conditions;

whereby the resistance of said circuit to single event upset conditions is enhanced and the writing speed of the circuit is not impaired.

2. The circuit of claim 1 which further comprises:

a first FET transfer device connected between said storage node and said first binary signal source, having its gate connected to said write enable signal;

a second FET transfer device connected between said second storage node and said second binary signal source, having its gate connected to said write enable signal;

whereby the binary states of said first and said second binary signal sources can be selectively connected to said first and said second storage nodes of said circuit.

3. The circuit of claim 1, which further comprises:

said first gated polysilicon resistor including a layer of polycrystalline silicon doped with N-type conductivity dopant;

said second gated polysilicon resistor having a polycrystalline silicon layer doped with N-type conductivity dopant.

4. The circuit of claim 1 which further comprises:

said first gated polysilicon resistor having its control electrode formed from a layer of polycrystalline silicon;

said second gated polysilicon resistor having its control electrode formed from a polycrystalline silicon layer.

* * * * *